United States Patent
Cochet et al.

(10) Patent No.: US 9,634,671 B2
(45) Date of Patent: Apr. 25, 2017

(54) DEVICE FOR GENERATING A CLOCK SIGNAL BY FREQUENCY MULTIPLICATION

(71) Applicant: STMicroelectronics (Crolles 2) SAS, Crolles (FR)

(72) Inventors: Martin Cochet, Grenoble (FR); Sylvain Clerc, Grenoble (FR)

(73) Assignee: STMICROELECTRONICS (CROLLES 2) SAS, Crolles (FR)

( * ) Notice: Subject to any disclaimer, the term of this patent is extended or adjusted under 35 U.S.C. 154(b) by 51 days.

(21) Appl. No.: 14/734,316

(22) Filed: Jun. 9, 2015

(65) Prior Publication Data

US 2016/0079984 A1    Mar. 17, 2016

(30) Foreign Application Priority Data

Sep. 15, 2014  (FR) ...................................... 14 58631

(51) Int. Cl.
| | |
|---|---|
| G06F 1/04 | (2006.01) |
| H03K 21/38 | (2006.01) |
| G06F 1/08 | (2006.01) |
| H03L 7/081 | (2006.01) |
| H03K 23/64 | (2006.01) |

(52) U.S. Cl.
CPC ............. H03K 21/38 (2013.01); G06F 1/08 (2013.01); H03L 7/081 (2013.01); H03K 23/64 (2013.01)

(58) Field of Classification Search
USPC ........................................................ 327/291
See application file for complete search history.

(56) References Cited

U.S. PATENT DOCUMENTS

| | | |
|---|---|---|
| 3,654,450 A | 4/1972 | Webb |
| 4,025,866 A | 5/1977 | Fletcher et al. |
| 4,933,890 A | 6/1990 | Nuytkens et al. |
| (Continued) | | |

FOREIGN PATENT DOCUMENTS

EP    1304804 A2    4/2003

OTHER PUBLICATIONS

Chao, Ting-Sheng et al: Designing Ultra-Low Voltage PLL Using a Bulk-Driven Technique, 2009 IEEE (4 pages).

(Continued)

*Primary Examiner* — Lincoln Donovan
*Assistant Examiner* — Patrick Chen
(74) *Attorney, Agent, or Firm* — Gardere Wynne Sewell, LLP

(57) ABSTRACT

A pulse signal generator has an input receiving an initial pulse signal having an initial period, an oscillator generating an oscillator signal, a first stage and a second stage. The first stage is synchronized with the oscillator signal and configured to deliver a secondary pulse signal having a separation between successive pulses that is representative of an integer part of a division of the initial period by an integer N. The first stage further delivers an auxiliary signal representative of a fractional part of the division and containing, for each pulse of the secondary pulse signal, an indication of a time shift to be applied to the pulse taking into account the separation. The second stage is configured to receive the successive pulses and the corresponding time shift indications and generate successive corresponding pulses of an output pulse signal.

21 Claims, 10 Drawing Sheets

(56) References Cited

U.S. PATENT DOCUMENTS

2001/0038314 A1 11/2001 Ichimaru
2013/0002321 A1* 1/2013 Cho .......................... H03L 7/00
327/158

OTHER PUBLICATIONS

INPI Search Report and Written Opinion for FR 1458631 dated May 21, 2015 (8 pages).
Park, Youngmin et al: "An All-Digital 12pJ/pulse 3.1-6.0GHz IR-UWB Transmitter in 65nm CMOS," Proceedings of 2010 IEEE International Conference on Ultra-Wideband (ICUWB2010) (4 pages).
Skyworks Solutions et al: "Basics of Dual Fractional-N Synthesizers/PLLs," Mar. 17, 2005, XP055189586, http://www.skyworksinc.com/uploads/documents/101463B.pdf (13 pages).
Tierno, Jose A. et al: "A Wide Power Supply Range, Wide Tuning Range, All Static CMOS All Digital PLL in 65 nm SOI," IEEE Journal of Solid-State Circuits, vol. 43, No. 1, Jan. 2008, pp. 42-51.

* cited by examiner

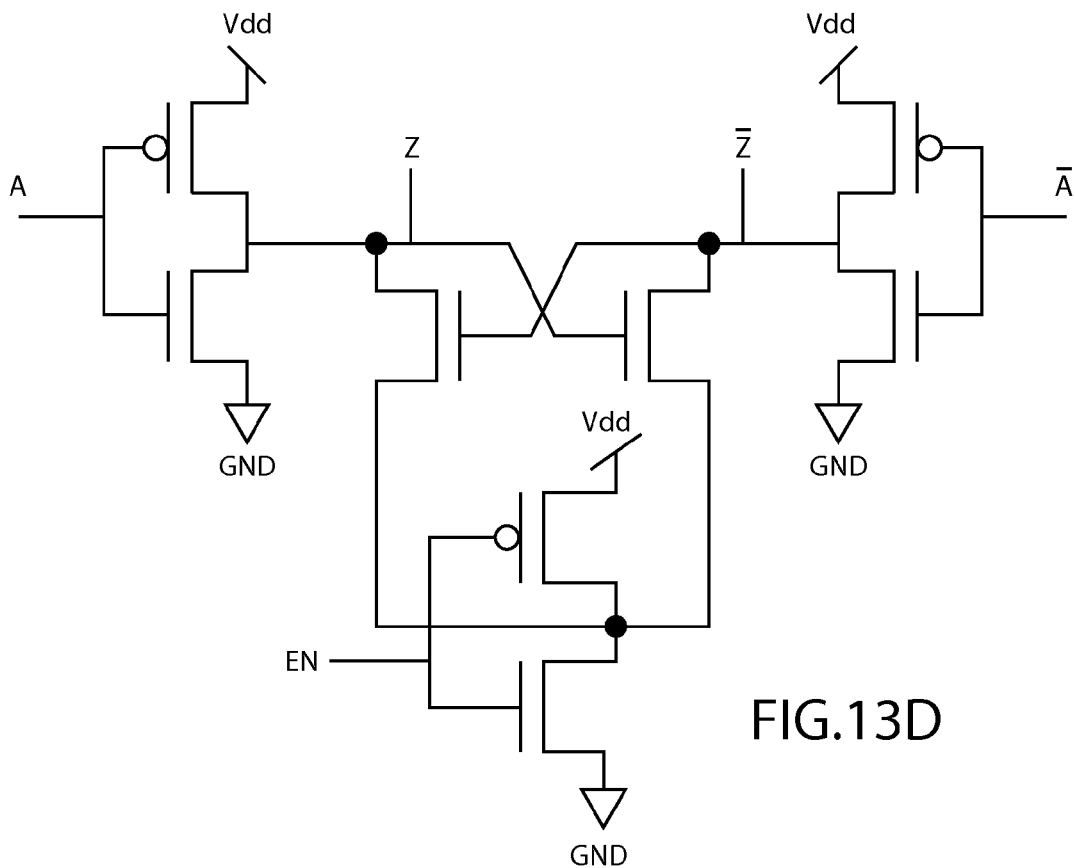
FIG.13D
FIG.14
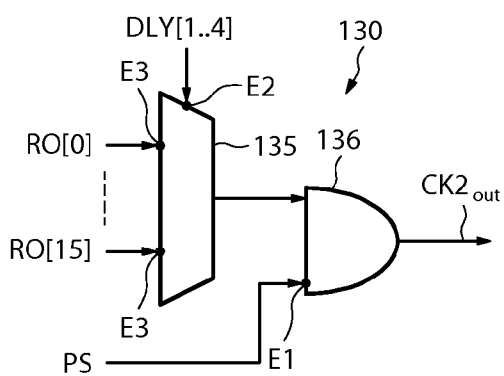
FIG.15
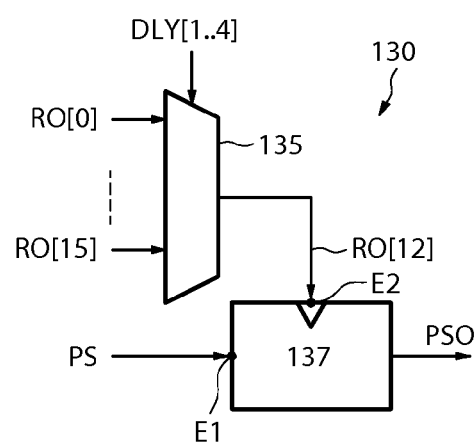

DEVICE FOR GENERATING A CLOCK SIGNAL BY FREQUENCY MULTIPLICATION

PRIORITY CLAIM

This application claims priority from French application for Patent No. 1458631 filed Sep. 15, 2014, the disclosure of which is incorporated by reference.

TECHNICAL FIELD

Various embodiments of the invention relate to the generation of clock signals by frequency multiplication with, in particular, a wide range of power supply voltage.

BACKGROUND

The devices for generating a clock signal by frequency multiplication offer the advantage of having a low power consumption while at the same time being free of jitter limitations in the long term.

Furthermore, the multiplication factor can be flexible and such devices can quickly come to a lock.

The solutions currently used are notably solutions based on phase-locked loops that are totally analog, totally digital or else analog and digital.

However, analog and analog/digital phase-locked loops operate within a limited range of power supply voltage and require design precautions in order to take into account the stability constraints in closed-loop mode. Furthermore, the design of purely analog phase-locked loops is complicated, whereas entirely digital phase-locked loops have an output frequency limited by the frequency range of the oscillator.

Another solution that has been envisaged resides in direct digital synthesis, but such a solution is limited in frequency.

SUMMARY

According to one embodiment, a device is provided for generating a clock signal by frequency multiplication using an architecture of the DDSS (Direct Digital Sampling and Synthesis) type operating in open-loop mode over a wide power supply voltage range.

According to one aspect, a device for generating a pulse signal is provided, comprising an input for receiving an initial pulse signal having an initial period, an oscillator, for example a ring oscillator, configured for generating at least one oscillator signal, a first stage synchronized with the at least one oscillator signal and configured for delivering a secondary pulse signal with a separation between two successive pulses that is representative of the integer part of a division of the initial period by an integer N and an auxiliary signal representative of the fractional part of the division and containing, for each pulse of the secondary pulse signal, an indication of a time shift to be applied to the pulse taking into account the separation between the pulse and the preceding pulse, and a second stage configured for receiving the successive pulses of the secondary signal and the corresponding shift indications and for generating the successive corresponding pulses of the pulse signal.

According to one possible embodiment, the second stage can comprise a first sub-stage carrying out the combination of the pulses of the secondary signal and of the associated shift indications in order to deliver an intermediate pulse signal whose period is equal to $T_{in}/2N$, where $T_{in}$ denotes the initial period, and a second sub-stage configured for carrying out a frequency division by two of the intermediate signal so as to deliver the pulse signal with a period equal to $T_{in}/N$.

As a variant, it could be possible to only conserve the first sub-stage so as to deliver a pulse signal with a period equal to $T_{in}/2N$.

According to yet another possible variant embodiment, the second stage could be configured for delivering directly the pulse signal with a period equal to $T_{in}/N$ without using frequency division by two.

The first stage is thus a synchronous logic driven by the oscillator signal. This architecture with two stages is an open-loop architecture and the division by N operation is carried out on sequenced static digital signals. An output frequency of the pulse signal is then obtained which may reach, as a maximum value, half the frequency of the oscillator signal and with a resolution identical to that of the division by N.

According to one embodiment, the first stage comprises: a first module receiving the initial pulse signal, synchronized to the at least one oscillator signal, and configured for delivering successions of first digital words representative of the integer part of the division by N of the ratio between the initial period and the period of the at least one oscillator signal and of second digital words representative of the fractional part of the division by N of the ratio, and a second module having a first counting circuit synchronized to the oscillator signal, a second counting circuit synchronized to the oscillator signal and incrementable by the current second digital word, and processing circuit configured, when the current value of the first counting circuit is equal to the value of the current first digital word, resetting the first counting circuit, to deliver a pulse of the secondary signal and deliver the content of the second counting circuit as an indication of time shift of the auxiliary signal associated with the pulse of the secondary signal.

According to one embodiment, the first module comprises: a detection circuit, synchronized to the oscillator signal, configured for detecting the edges, for example homologous edges, such as rising edges, of the initial pulse signal and delivering control signals in response to the occurrences of these edges, (the edges detected are not necessarily homologous but may be of either type, for example opposing, in such a manner as to then measure the half-period of the input signal), an initial counting circuit synchronized to the oscillator signal, resettable at the occurrence of each control signal, a synchronous flip-flop whose data input is connected to the output of the initial counting circuit and controlled by the control signal so as to deliver, when a control signal occurs, the current first digital word and the current second digital word.

According to one embodiment, the detection circuit comprises an edge-triggered D flip-flop, periodically timed by the at least one oscillator signal, designed to receive the initial pulse signal, and a logic circuit comprising a logic gate having a first input connected to the output of the D flip-flop, a second input connected to the input of the D flip-flop, and an output designed to deliver the successive control signals.

The initial counting circuit and the synchronous flip-flop are advantageously timed by a timing signal whose period is twice the period of the at least one oscillator signal.

With regard to the second stage, as indicated hereinbefore, several possibilities exist.

Thus, according to a first variant, the second stage comprises at least one delay line modulatable and configurable by the auxiliary signal and designed to receive the secondary pulse signal at the input.

According to one embodiment, the indication of the time shift of the auxiliary signal to be applied to the pulse of the secondary signal comprises a digital word of b bits, the at least one delay line comprises b1 elementary modules, b1 being equal to at least $2^b$, each elementary module being configured for delaying a pulse of the secondary signal by a delay equal, or substantially equal, to the period of the at least one oscillator signal divided by $2^b$; furthermore a selection circuit is configured for selecting one or more elementary modules depending on the value of the digital word of b bits.

According to one embodiment, the second stage comprises a first sub-stage performing the combination of the pulses of the secondary signal and of the associated shift indications in order to deliver an intermediate pulse signal whose period is equal to $T_{in}/2N$, where $T_{in}$ denotes the initial period, and a second sub-stage configured for carrying out a frequency division by two of the intermediate signal of so as to deliver the pulse signal with a period equal to $T_{in}/N$.

According to one embodiment, the first sub-stage of the second stage comprises several configurable delay lines connected in parallel between a state machine configured for receiving the secondary pulse signal and the auxiliary signal, and an OR logic gate delivering the intermediate pulse signal.

The value of b1 is advantageously greater than $2^b$.

A first calibration circuit is advantageously configured for selecting, for each delay line, $2^b$ elementary modules from amongst the b1 elementary modules.

According to one embodiment, the device comprises several structurally identical initial oscillators and a second calibration circuit configured for selecting the oscillator from amongst the initial oscillators.

When the initial oscillators and the delay lines are formed using a technology of the fully depleted silicon-on-insulator type and comprise buried electrodes, the first and second calibration circuits advantageously comprise a biasing circuit capable of biasing the buried electrodes.

However, as a variant, instead of delaying the pulse of the secondary pulse signal with a delay line, it is possible, according to another variant, to use a multiphase oscillator and to select one of the phases depending on the value of the auxiliary signal in order to generate the pulse signal, starting from the secondary pulse signal.

Such a variant offers the advantage that the range of selection is exactly equal to one period without needing to be calibrated.

More precisely, according to one embodiment, the indication of the time shift of the auxiliary signal to be applied to the pulse of the secondary signal comprises a digital word of b bits, the at least one oscillator is a multi-phase oscillator configured for delivering $2^b$ oscillator elementary signals, one of the oscillator elementary signals forms the at least one oscillator signal, and the $2^b$ oscillator elementary signals are time-shifted by a shift equal, or substantially equal, to the period of the at least one oscillator signal divided by $2^b$.

Furthermore, the second stage comprises first input for receiving the pulse of the secondary signal, second input for receiving the digital word of b bits, third input for receiving the $2^b$ oscillator elementary signals, and the second stage is configured for selecting one of the oscillator elementary signals depending on the value of the digital word of b bits and for generating the pulse signal starting from the secondary pulse signal and from the selected oscillator elementary signal.

According to one embodiment, the second stage comprises a processing circuit forming a first sub-stage, comprising first, second and third inputs and configured for selecting the one of the oscillator elementary signals depending on the value of the digital word of b bits and for generating, starting from the secondary pulse signal and from the selected oscillator elementary signal, an intermediate pulse signal whose period is equal to $T_{in}/2N$, where $T_{in}$ denotes the initial period of a pulse signal; the second stage furthermore comprises a second sub-stage configured for carrying out a frequency division by two of the intermediate signal so as to deliver the pulse signal with a period equal to $T_{in}/N$.

The processing circuit comprises, for example, a multiplexer whose data inputs form the third input, whose control input forms the second input, and an AND logic gate one input of which is connected to the output of the multiplexer and another input of which forms the first input.

According to one embodiment, the second stage comprises at least one synchronous flip-flop whose data input forms the first input and whose clock input forms the second input.

According to another aspect, an integrated circuit is provided comprising a device such as defined hereinbefore.

BRIEF DESCRIPTION OF THE DRAWINGS

Other advantages and features of the invention will become apparent upon examining the detailed description of non-limiting embodiments and the appended drawings in which:

FIGS. 1 to 12, 13A to 13D, and 14 to 18 illustrate schematically various embodiments of a device for generating a pulse signal.

DETAILED DESCRIPTION

Figure 1:
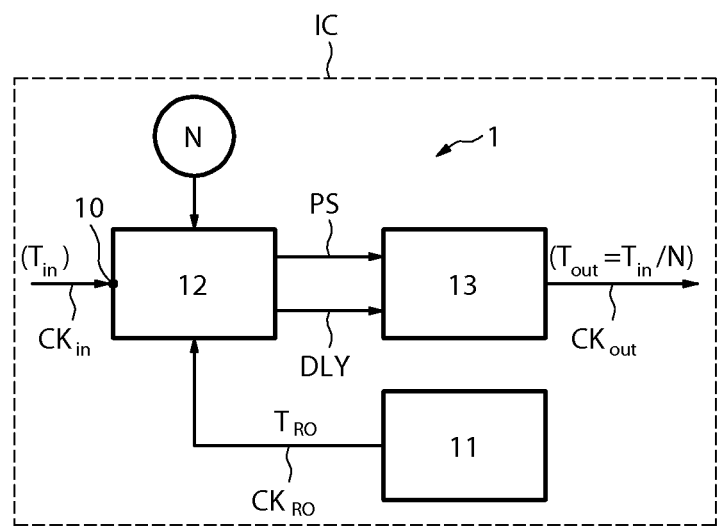

In FIG. 1, the reference 1 denotes a device for generating a pulse signal $CK_{out}$, here implemented in an integrated manner within an integrated circuit IC.

This device 1 comprises an input 10 for receiving an initial pulse signal or initial clock signal $CK_{in}$, coming for example from a quartz crystal oscillator and having an initial period $T_{in}$.

The device 1 furthermore comprises an oscillator 11, for example a ring oscillator, here configured for generating a pulsed oscillator signal $CK_{RO}$, or clock oscillator signal, having a period $T_{RO}$.

The device 1 also comprises a first stage 12, synchronized with the oscillator signal $CK_{RO}$ and configured for delivering a secondary pulse signal PS for which, as will be seen in more detail hereinafter, the separation between the pulses is representative of the integer part of a division of the initial period $T_{in}$ by an integer N.

The first stage 12 is also configured for delivering an auxiliary signal DLY representative of the fractional part of the division and containing, for each pulse of the secondary signal, an indication of a time shift to be applied to the pulse taking into account the separation between the pulse and the preceding pulse.

The device 1 also comprises a second stage 13 configured for receiving the secondary pulse signal PS and the auxiliary signal DLY and for delivering the pulse signal $CK_{out}$ having a period $T_{out}$ equal to $T_{in}/N$.

Figure 2:
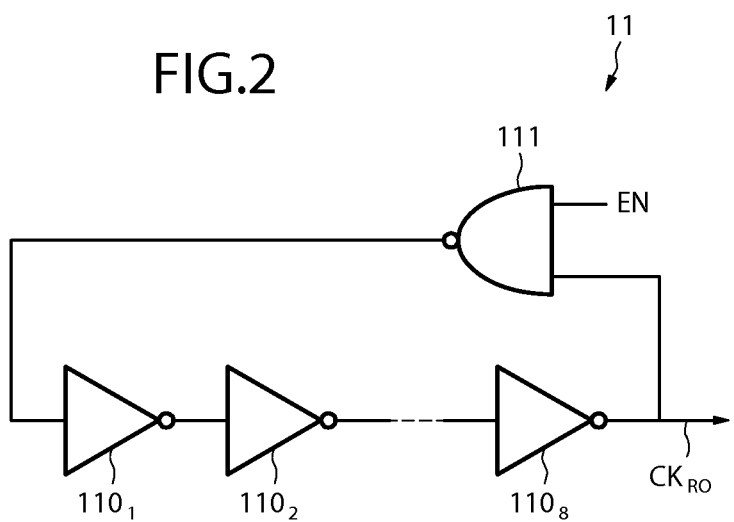

As indicated hereinbefore and illustrated schematically in FIG. 2, the oscillator 11 can be a ring oscillator with a conventional structure known per se and comprising several inverters, here eight inverters $110_1$-$110_8$ with a feedback loop via a NAND logic gate 111. A logic signal EN received on one of the inputs of the gate 111 enables the oscillator, the last inverter $110_8$ delivering the oscillator signal $CK_{RO}$.

Figure 3:
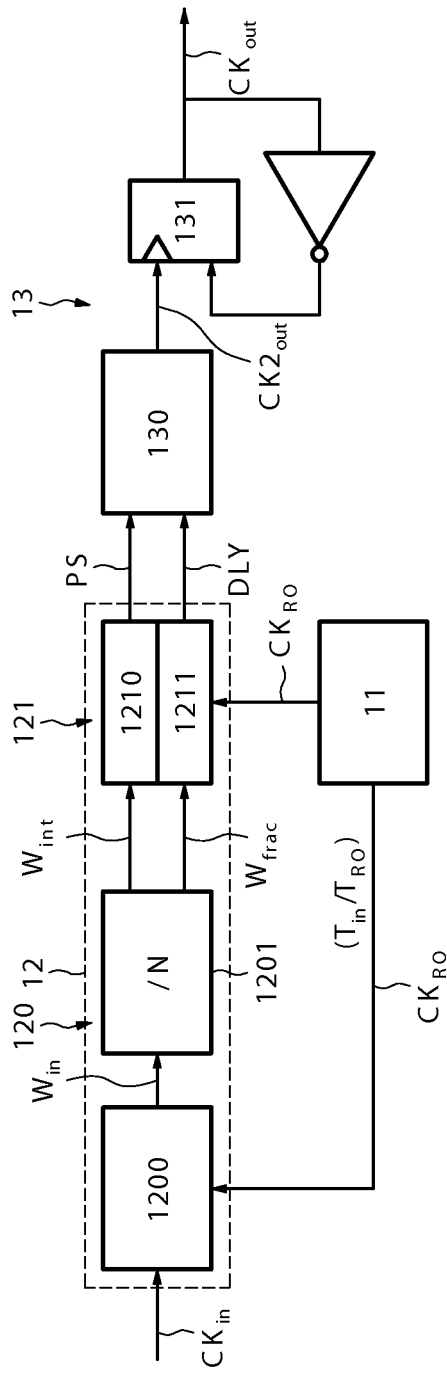

In FIG. 3, it can be seen that the first stage 12, which is a synchronous logic stage, comprises a first module 120 receiving the initial pulse signal $CK_{in}$ synchronized to the oscillator signal $CK_{RO}$. This first module 120 is configured for delivering successions of first digital words $W_{int}$ representative of the integer part of the division by N of the ratio $T_{in}/T_{RO}$ and of second digital words $W_{frac}$ representative of the fractional part of the division by N of this ratio $T_{in}/T_{RO}$. This ratio is the period of the signal Win delivered by a detection circuit 1200 whose functionality will be discussed in more detail hereinafter.

The first stage 12 furthermore comprises a second module 121 having a first counting circuit 1210 synchronized to the oscillator signal $CK_{RO}$ and a second counting circuit 1211 also synchronized to the oscillator signal.

It will be seen in more detail hereinafter that the first counting circuit participates in the delivery of the secondary pulse signal PS, whereas the second counting circuit participates in the delivery of the auxiliary signal DLY.

In the example illustrated in FIG. 3, the second stage 13 here comprises a first sub-stage 130 having at least one configurable delay line designed to delay each pulse of the secondary pulse signal PS by a delay defined by a digital word of the auxiliary signal DLY, so as to deliver an intermediate pulse signal $CK2_{out}$ having a frequency which is twice the frequency of the pulse signal $CK_{out}$ delivered at the output of the device 1.

For this purpose, a second sub-stage 131 is provided comprising a divider configured for dividing this frequency by two and having a flip-flop with a feedback loop via an inverter.

Figure 4:
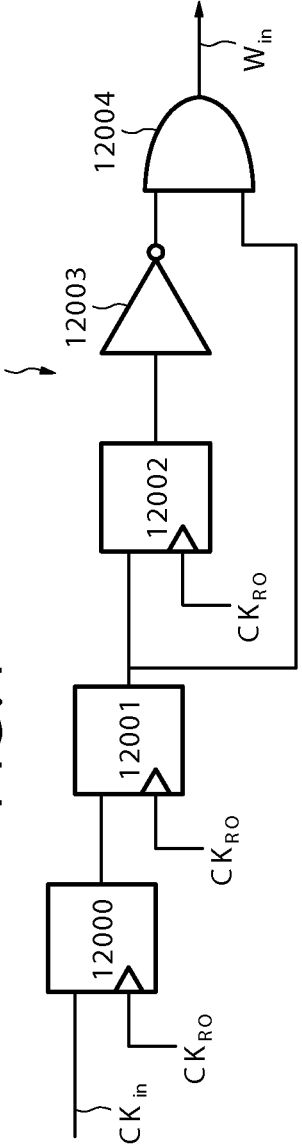
Figure 5:
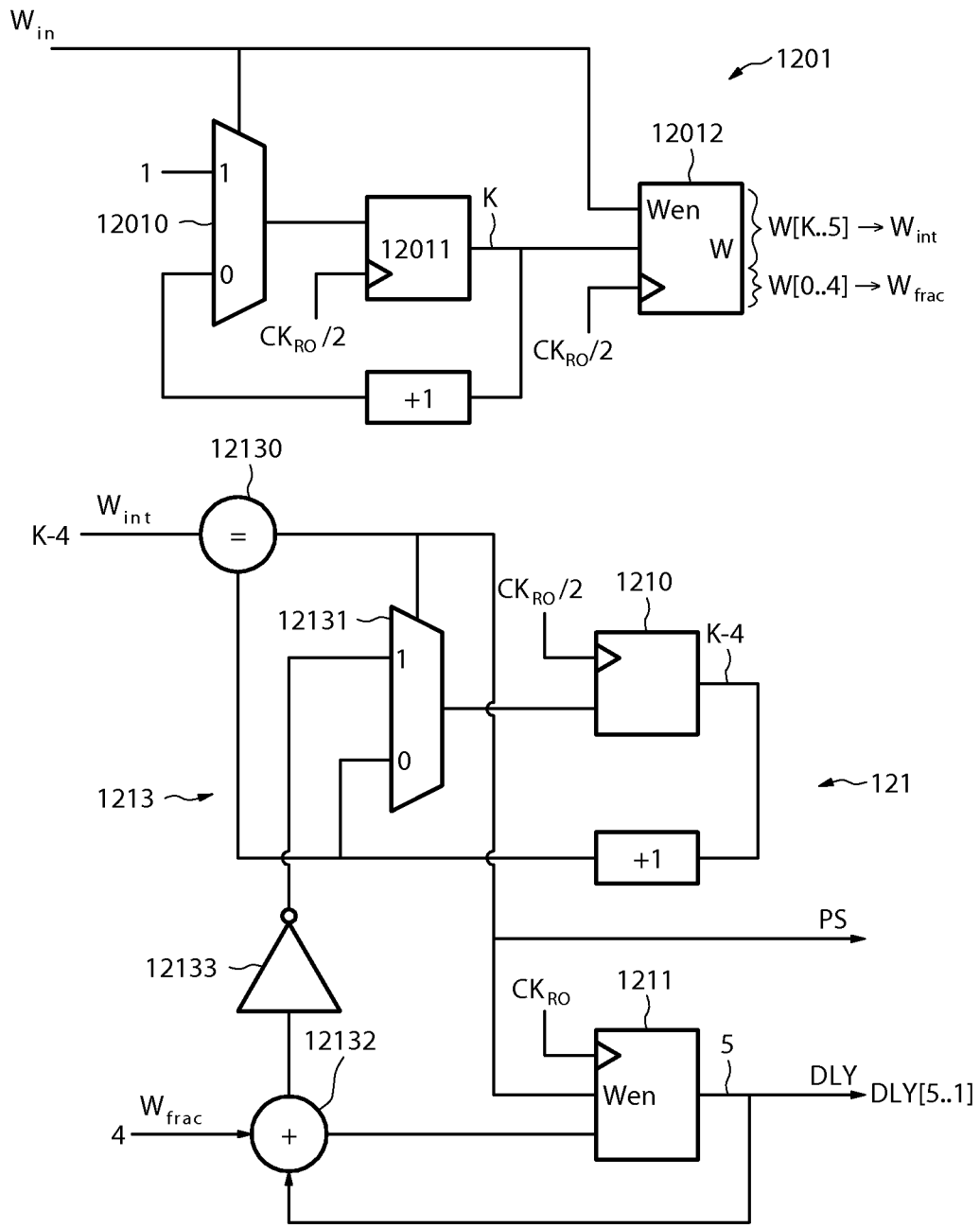

Reference is now more particularly made to FIGS. 4 and 5, which illustrate a representation in RTL language of the various elements of the first stage 12.

For this purpose, it is assumed that the number N is equal to 64 and that the initial period $T_{in}$ is equal to 296 times the period $T_{RO}$ of the oscillator signal. Furthermore, the period $T2_{out}$ of the intermediate signal $CK2_{out}$ is equal to 1/64th of the initial period $T_{in}$, i.e. 4+10/16.

As indicated hereinbefore, the first module 120 comprises the detection circuit 1200. This detection circuit 1200 is synchronized to the oscillator signal $CK_{RO}$ and configured for detecting the homologous edges, here the rising edges, of the initial clock signal $CK_{in}$ and delivering rising edges of the signal $W_{in}$ in response to the occurrence of each of these homologous edges. These rising edges of the signal Win act as control signals, as will be seen hereinafter.

More precisely, as illustrated in FIG. 4, the detection circuit 1200 comprises first of all two cascaded flip-flops 12000 and 12001 timed by the oscillator signal $CK_{RO}$. The flip-flop 12000 receives the initial clock signal $CK_{in}$.

These two flip-flops, although not indispensable, advantageously allow any potential metastable states to be eliminated.

The detection circuit 1200 furthermore comprise an edge-triggered D flip-flop 12002 timed by the oscillator signal $CK_{RO}$, designed to receive the initial clock signal (after potentially passing through the two cascaded flip-flops 12000 and 12001), together with a logic circuit comprising an AND logic gate 12004 having a first input connected to the output of the D flip-flop 12002 here via an inverter 12003 and having a second input connected to the input of the D flip-flop 12002.

The output of the logic gate 12004 delivers the successive control signals (rising edges of the signal $W_{in}$). As indicated hereinbefore, the period of the signal $W_{in}$ is equal to the ratio $T_{in}/T_{RO}$.

As a variant, it would be possible to replace the gates 12003 and 12004 by an EXCLUSIVE OR (XOR) gate which allows the rising and falling edges to be detected, and thus the half-period of the input signal to be measured. This change reduces the response time (period of time between the change of the input period and the change of the output period) because the change of input period is detected in a ½ cycle instead of one cycle. However, this renders the circuit sensitive to the duty cycle of the input signal.

The first module also comprises (FIGS. 3 and 4) a block 1201 which will deliver the various digital words $W_{int}$ and $W_{frac}$.

The block 1201 (FIG. 5) comprises an initial counting circuit 12011 timed by a timing signal $CK_{RO}/2$ whose period is twice the period of the oscillator signal $CK_{RO}$. The output of this initial counting circuit 12011 is fed back onto its input via a multiplexer 12010, controlled by the signal $W_{in}$, which, when it is on its input 0, allows this initial counting circuit to be incremented.

Furthermore, this initial counting circuit 12011 is resettable upon the occurrence of each rising edge of the signal $W_{in}$. The size of the initial counting circuit 12011 is equal to K. This value K limits the maximum value of the pulse signal $CK_{out}$. Thus, the ratio between the maximum frequency and the minimum frequency of the signal $CK_{out}$ is of the order of $2^K$.

A value of 7 for K is reasonable and is a good compromise between, on the one hand, the size of the registers and of the adders and, on the other hand, the power consumption together with the speed of execution of the circuit 1.

The block 1201 also comprises a synchronous flip-flop 12012, also timed by the timing signal $CK_{RO}/2$ and connected to the output of the initial counting circuit 12011.

The synchronous flip-flop 12012 is also enabled on its input Wen by the signal $W_{in}$.

At each rising edge of the signal $W_{in}$, the synchronous flip-flop 12012 delivers a word of K bits whose five least significant bits (in this example) form the current second digital word $W_{frac}$ representative of the fractional part of the division by N and whose remaining bits (here the bits 5 . . . K) form the current first digital word $W_{int}$ representative of the integer part of the division.

The number of bits of the word $W_{frac}$ is chosen as a function of the value of N and of the desired resolution.

In the example described here, the resolution is $1/16^{th}$ and five bits are chosen. In fact, it would have been possible to only choose four bits, but the bit 0 is added here in order to increase the effective resolution without adding any jitter.

The first counting circuit 1210 of the second module 121, timed by the oscillator signal $CK_{RO}$, may be incremented by feeding back its output onto its input via the multiplexer 12131.

The second counting circuit 1211, also timed by the oscillator signal $CK_{RO}$, may be incremented by the current second digital word $W_{frac}$ by means of an adder 12132.

This second module 121 also comprises a processing circuit configured, when the current value of the first counting circuit 1210 is equal to the value of the current first digital word $W_{int}$ (comparator 12130), to reset the first counting circuit 1210 via the input 1 of the multiplexer 12131 and deliver a pulse of the secondary signal PS.

Furthermore, the first processing circuit allows, via the enable input $W_{en}$ of the second counting circuit 1211, the delivery of the content of this second counting circuit as an indication of time shift of the auxiliary signal DLY associated with the pulse of the secondary signal PS. This indication of time shift is therefore a digital word that, for the sake of simplification, will be denoted by DLY in the following part of the description.

Figure 6:
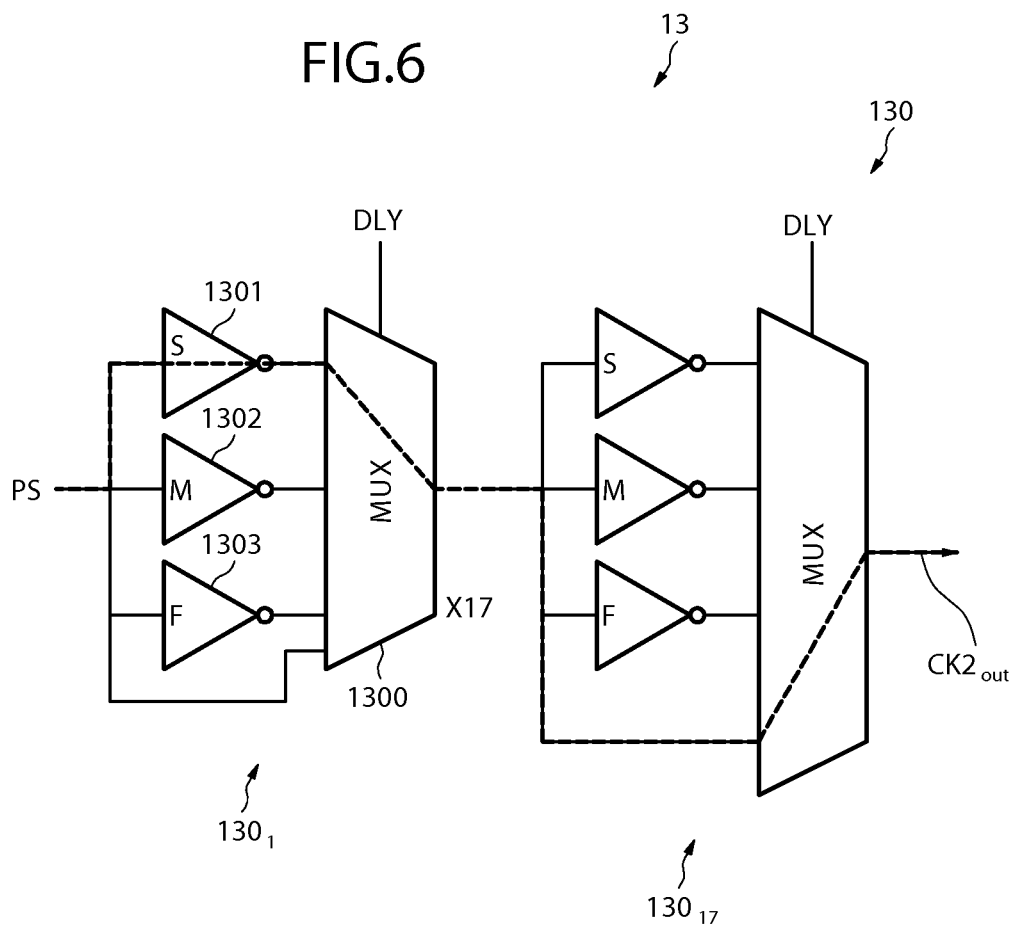

As illustrated in FIG. 6, the first sub-stage of the second stage 13 here comprises a delay line 130 having b1 elementary modules $130_i$, with b1 here equal to 17. In fact, b1 is equal to at least $2^b$, where b is the number of bits in the digital word DLY.

Each elementary module $130_i$ is configured for delaying a pulse of the secondary signal by a delay equal, or substantially equal, to the period of the oscillator signal divided by $2^b$. In the example described here, since b is equal to 4 (the bit 0 used for the jitter is indeed not taken into account), each elementary module is configured for delaying a pulse of the secondary signal by a delay equal to 1/16 of the period of the oscillator signal.

Each elementary module $130_i$ comprises a multiplexer 1300 having four inputs. The first three inputs are connected to three inverters 1301, 1302, 1303 having different propagation times (slow, medium, fast). A fourth input receives directly the pulse of the secondary signal PS. Depending on the value of the word DLY, the signal PS will pass through, or will not pass through, an inverter of the corresponding elementary module. The choice of this inverter is determined by calibration as will be seen in more detail hereinafter.

Figure 7:
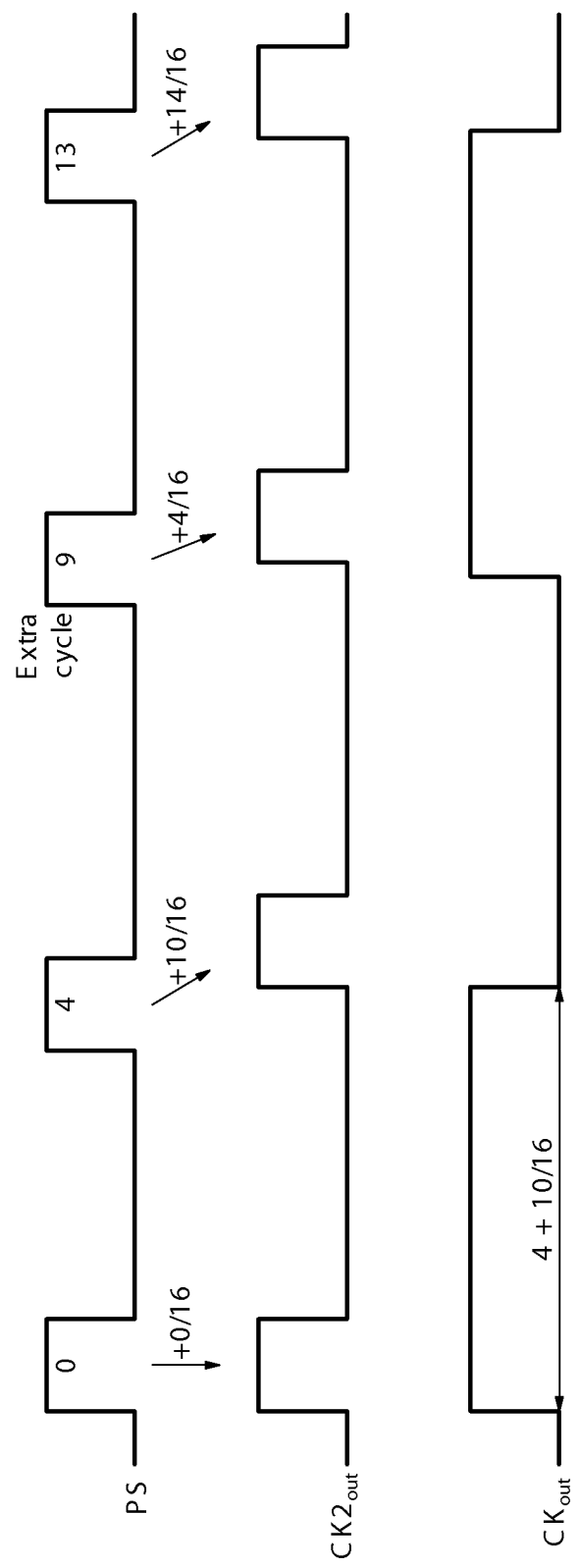

FIG. 7 illustrates one example of operation of the device which has just been described.

At the cycle 0, a pulse of the secondary pulse signal PS is generated with a shift of 0/16. Four cycles later, which corresponds to the integer part of the division by 64, another pulse of the signal PS is generated. The latter is time-shifted by 10/16, which supplies a corresponding pulse of the intermediate signal $CK2_{out}$.

The following pulse of the signal PS could be generated four cycles later while being displaced by 20/16. However, for reasons of simplicity, it is then preferable to shift the additional pulse PS of an additional cycle (extra cycle) and to displace this pulse by 4/16. This is obtained by virtue of the overflow signal delivered by the adder 12132 (FIG. 5) and which is delivered via an inverter 12133 to the input 1 of the multiplexer 12131.

The following pulse of the signal PS is again shifted by four cycles and this pulse is itself time-shifted by 4/16+10/16, in other words 14/16.

Before going into the divider 131, the pulse signal $CK2_{out}$ is then obtained with a period equal to 4+10/16, in other words 1/64$^{th}$ of the initial period $T_{in}$, itself equal to 296 times the period $T_{RO}$ of the oscillator signal but with a degraded duty cycle. At the output of the divider 131, the signal $CK_{out}$ has a period of 9+4/16, being 1/32$^{th}$ of the initial period Tin, and a duty cycle of 50%.

Figure 8:
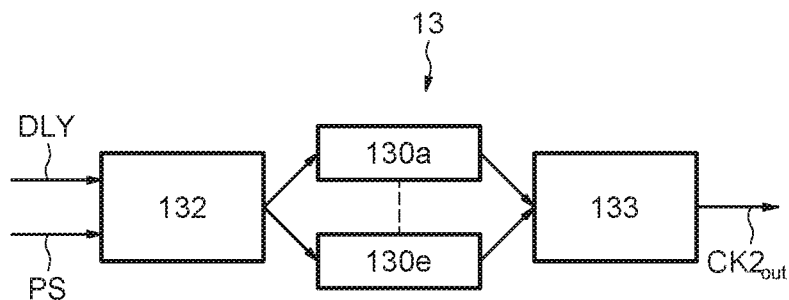

Since the propagation time inside of the delay line is here, by construction, greater than the period of the oscillator signal, it is preferable to provide, as illustrated schematically in FIG. 8, several delay lines, here five delay lines 130a-130e, all connected at the input to a distribution unit (state machine) 132 receiving the signals PS and DLY, and all connected at the output to a logic gate 133, here an OR logic gate, delivering the intermediate pulse signal $CK2_{out}$.

It is particularly advantageous to carry out a calibration of the oscillator with respect to the synchronous logic (first stage) and to also carry out a calibration of the delay line aiming to adjust the division principle described hereinbefore, in order to take into account variations in temperature, in voltage and in fabrication process (PVT), in particular for applications with very low power supply voltage (Ultra Low Voltage: ULV).

Figure 9:
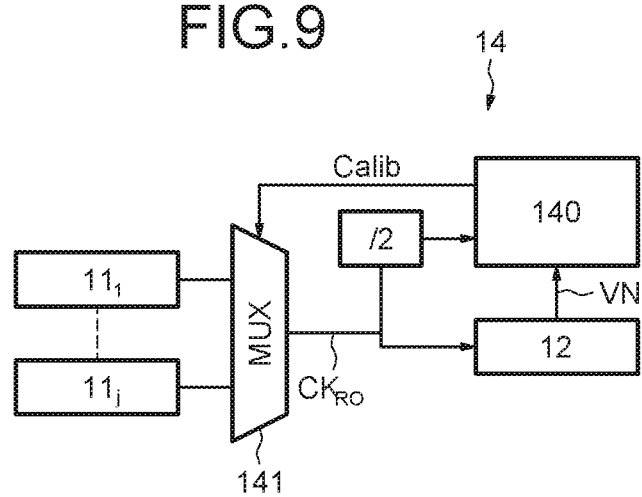

FIG. 9 illustrates a calibration circuit 14 for selecting from amongst a set of several initial oscillators $11_1$-$11_j$ that are structurally identical, for example three ring oscillators, the oscillator 11 that will be the best matched with the synchronous block 12. For this purpose, the calibration circuit 14 comprises a multiplexer 141 receiving the various oscillator signals at its input and delivering, upon a command from a signal CALIB, the oscillator signal from the oscillator selected. A calibration state machine 140 could receive a violation signal VN for the case where the selected oscillator is not correctly calibrated on the synchronous logic.

More precisely, the state machine 140 changes the selection of the multiplexer 141 so that the clock signal from the synchronous block 12 is supplied successively by the oscillators $11_1$ to $11j$. The state machine 140 measures, for example using a counter system, the period of these clock signals and the synchronous block 12 is equipped with a system detecting configuration (or "setup") violations supplying a signal VN to the state machine 140 in the case of a violation. The state machine then chooses as post-calibration adjustment "Calib" the oscillator with the shortest period not having caused a violation VN.

The detection of a violation may, by way of example, be carried out by instrumentalized flip-flops (known as Razor or Canary flip-flops) or else by the injection into the input of the block 12 of a signal whose period is respectively equal to that of the selected oscillator ($11_1$ to $11j$). The testing of the validity of the output signals from the block 12 (PS and DLY) then generates the signal VN.

It may finally be noted that the clock signal of the state machine 140 is advantageously obtained, in the present example, by dividing by 2 the frequency of the signal $CK_{RO}$. This allows the "setup" violations of the synchronous logic 140 to be avoided if one of the oscillators $11_1$ to $11j$ was found to have a shorter period than that expected.

Figure 10:
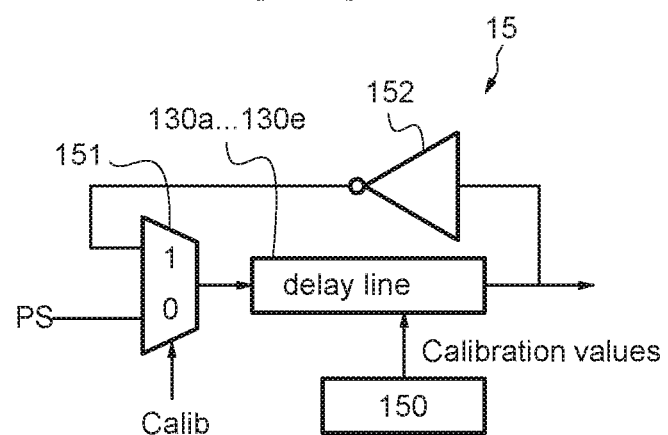

Similarly, as illustrated in FIG. 10, calibration circuit 15 allows the delay line to be calibrated in order to match it with the oscillator while complying with the division principle described hereinbefore, in other words to select, for each delay line 130a-130e, $2^b$ elementary modules from amongst the b1 elementary modules (b=4 and b1=17).

On the other hand, the state machine 150 notably allows it to be configured, for each elementary module, which of the slow, medium or fast inverters will be chosen. More precisely, the type of inverter will be chosen, upstream of the calibration, for suitability with the type of oscillator that has previously been chosen (as described in FIG. 9) so as to suit the frequency of operation of the synchronous block 12. Owing to the redundancy of elementary modules (17 instead of 16), a number of choices greater than or equal to 17 is furthermore obtained.

More precisely, in calibration mode (Calib signal equal to 1), the input multiplexer 151 is adjusted so as to feed back the delay line, which, by virtue of the inverter 152, then behaves as a ring oscillator whose period is equal to the sum of the propagation time of a rising edge and of the propagation time of a falling edge in the line for the command over b1 bits then supplied by the state machine 150.

For each delay k ($0 \le k < 2^b$), the state machine tests k amongst b1 combinations of the line allowing this delay to be produced and measures the corresponding propagation period by counting the oscillation period of the line fed back. The state machine records the difference between this period and that of the oscillator previously selected. After having run through all the possible configurations for the delay k, the machine notes the optimum configuration (i.e. the minimum difference between the delay line and the oscillator) in a configuration register.

In the case of values of k close to b½, the number of configurations to be tested, k from amongst b1, becomes very large (for example 24310 for b1=17 and k=8 or 9). In this case, the state machine may test only a part of these configurations, and then stop according to a defined criterion, for example after having found a configuration of relative error lower than a chosen threshold.

Finally, it may be noted that by advantageously choosing to take $b1 \geq 2^b+1$ (and not b1=2b) and to make a delay command k correspond, not to the selection of k, but of k+1 delay elements, it is ensured that there are always k+1 from amongst b1 possibilities of calibration for each delay, i.e. at least b1 possibilities for all the values of k.

In other words, when $b1 \geq 2^b+1$, the first calibration circuit (15) are configured for selecting, for each delay line and for each delay, the corresponding number of elementary modules with at least b1 possibilities of choice.

It may also be noted that, by including an additional delay line with respect to the minimum number needed in parallel, the calibration can be carried out while at the same time maintaining the operation of the circuit.

Figure 11:
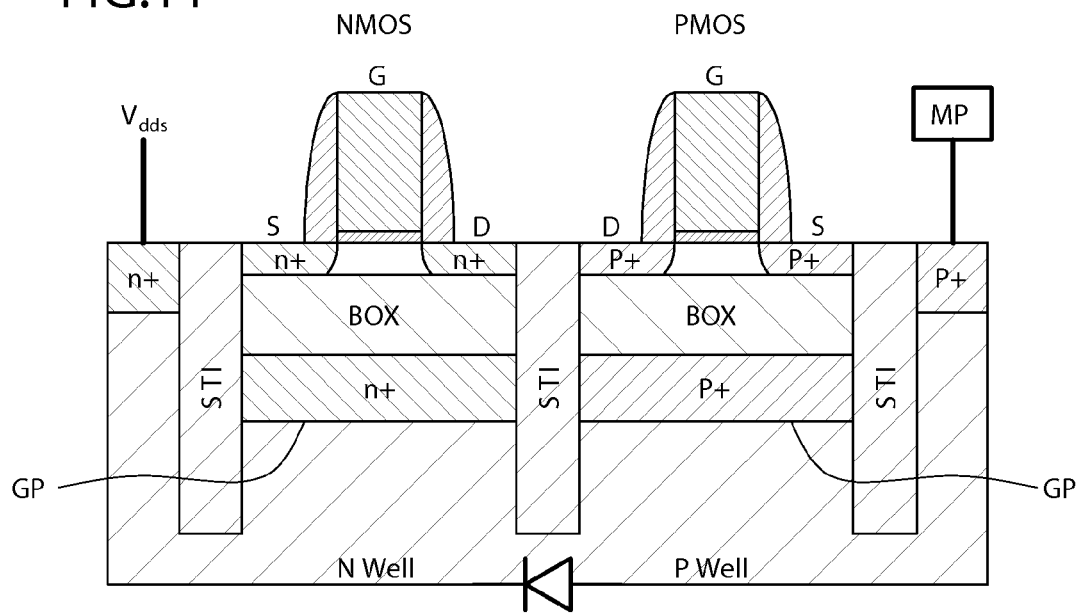

When the initial oscillators and the delay lines are constructed using a technology of the fully depleted silicon-on-insulator (FDSOI) type, well known to those skilled in the art, such as that illustrated in FIG. 11 in which the transistors NMOS and PMOS (formed within and on a film of silicon resting on a buried layer of oxide BOX itself resting on a semiconductor carrier substrate) comprise buried electrodes GP (Ground Plane) formed by implantation within N and P wells, it is possible to carry out a calibration of the oscillators with respect to the delay lines by using biasing circuit MP and/or $V_{dds}$ configured for biasing the buried electrodes GP. It will be noted that this method could be applied not only for the configuration known as LVT (low-voltage threshold) described in the FIG. 11, but also for all the other doping configurations of the buried electrodes.

As has just been seen, in the variant which has just been described, the fractional division is implemented by delay lines which must have the same delay characteristics as the ring oscillator. This imposes a calibration step and renders the circuit more complex which can contain up to around 2000 calibration registers for b=4 and b1=17. Moreover, an imperfect calibration leads directly to an increase in the jitter of the synthesized clock signal $CK_{out}$.

This method of division may advantageously be replaced by a multiphase system which allows a native synchronization of the delay with the period of the oscillator.

Figure 12:
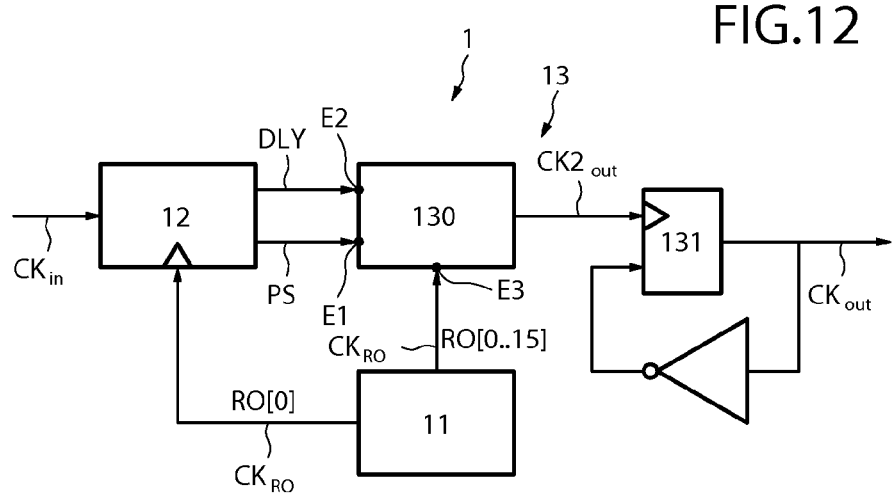

For this purpose, as illustrated schematically in FIG. 12, a multiphase ring oscillator is used and the same first stage 12 is conserved as that which has been described hereinbefore and which delivers the secondary pulse signal PS and the auxiliary signal DLY.

Furthermore, as will be seen in more detail hereinafter, for adding a delay to a pulse of the signal PS, a selection of a particular phase RO[k] of the multiphase oscillator is used rather than delaying the pulse with a delay line. Thus, it is sure that the selection range RO[0]-RO[15] is exactly equal to one period without additional calibration.

More precisely, as illustrated in FIG. 12, the indication of the time shift of the auxiliary signal DLY to be applied to the pulse of the secondary signal PS comprises a digital word of b bits.

The oscillator 11 is a multiphase oscillator configured for delivering $2^b$ oscillator elementary signals.

In the present case, b is equal to 4 and the multiphase oscillator therefore delivers 16 oscillator elementary signals RO[0]-RO[15].

One of the oscillator elementary signals (for example the elementary signal RO[0]) forms the oscillator signal $CK_{RO}$ which will synchronize the first stage 12.

Since the phases are equally distributed, the $2^b$ oscillator elementary signals are time-shifted by a shift equal, or substantially equal, to the period of the oscillator signal $CK_{RO}$ divided by $2^b$, in the present case 16.

The second stage 13 comprises first input E1 for receiving the pulses of the secondary pulse signal PS, second input E2 for receiving the successive digital words of b bits DLY, and third input E3 for receiving the $2^b$ oscillator elementary signals.

The second stage furthermore comprises a processing circuit 130 configured for selecting one of the oscillator elementary signals depending on the value of the digital word of b bits DLY and for generating the intermediate pulse signal $CK2_{out}$ using the secondary pulse signal PS and the selected oscillator elementary signal RO[i].

In this variant embodiment, the processing circuit 130 forms a first sub-stage of the second stage 13 and is followed, as in the variant described hereinbefore, by a second sub-stage comprising the divider 131 and delivering the pulse signal $CK_{out}$.

However, it is possible in other variant embodiments for the processing circuit of the second stage 13 to directly deliver the pulse signal $CK_{out}$, for example by providing a duty cycle equal to the desired value, (typically 50% for a usual application, but if needed another value may be chosen) which allows the need for the frequency divider 131 to be obviated.

Figure 13A:
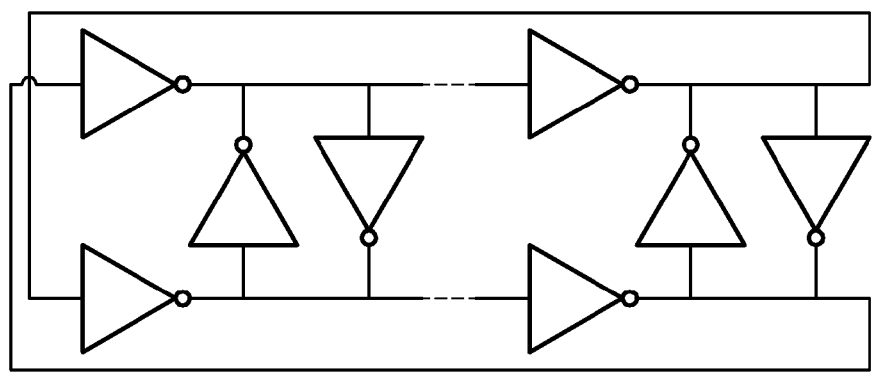
Figure 13B:
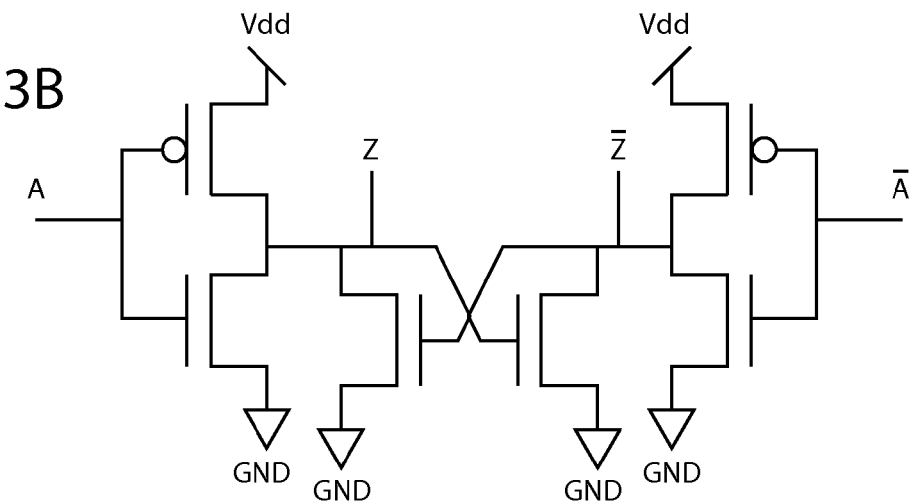

As illustrated in FIGS. 13A-13B, the multiphase oscillator RO can be a ring oscillator comprising for example a pseudo-differential structure well known to those skilled in the art. The addition of an enable signal allows the dynamic power consumption of the circuit to be eliminated when it is not used.

Figure 13C:
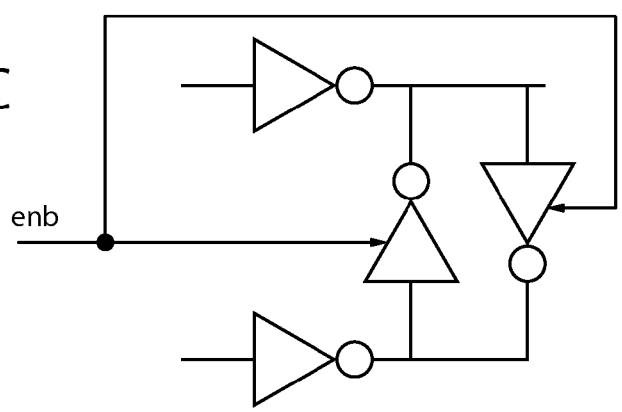

In the case of a structure such as that illustrated in FIG. 13A, this may advantageously be achieved by using 3-state inverters (FIG. 13C). When they are placed in a high-impedance state (Hi-Z) (signal enb equal to 1), the two parts of the oscillator are effectively decoupled which then interrupts the oscillation.

In the case of a structure of the type of that illustrated in FIG. 13B, which shows a pseudo-differential inverter stage usable in a multi-phase ring oscillator, the control can be achieved by the addition of two complementary transistors, as illustrated in FIG. 13D. The oscillator is stopped when the signal EN is equal to 0.

It may be noted that these methods for disabling a multi-phase oscillator are not specific to the architecture of the frequency multiplier and could be used for other applications of a multi-phase oscillator.

FIG. 14 illustrates schematically a first possible embodiment of the processing circuit.

More precisely, the latter comprise a multiplexer 135 whose data inputs form the third input E3, whose control input forms the second input E2 and whose output is connected to a first input of an AND logic gate 136. The other input of this logic gate 136 forms the first input E1 intended to receive the secondary pulse signal PS. The output of the logic gate 136 delivers the intermediate pulse signal $CK2_{out}$.

Thus, depending on the value of the four-bit word DLY, one of the phases of the oscillator is selected and combined with the pulse of the secondary signal PS so as to delay it and to form a pulse of the intermediate signal $CK2_{out}$.

This way of operating is well suited to certain phases, for example the phases different from the end phases RO[0] and RO[15], but may, in certain cases, pose two problems. More precisely, over a window of 1 cycle, the end phases RO[0] and RO[15] are too close to the start/end of the signal DLY to be able to be selected with certainty taking into account the time for propagation and for establishment of the commands.

Furthermore, only the rising edge and not the high state of the preceding cycle should be selected. Otherwise, an undesirable error is introduced that can affect the output frequency.

In order to overcome these problems, the embodiment illustrated schematically in FIGS. 15 to 18 may be used.

In order to select only the rising edges, without any error associated with the preceding cycle, a synchronous flip-flop 137 is used whose data input forms the first input E1 and whose clock input forms the second input E2. More precisely, the second input E2 is connected to the output of the multiplexer 135 which delivers the selected phase, here the phase RO[12], depending on the value of the 4-bit digital word DLY.

In other words, the secondary pulse signal PS serves as a selection window and the phase to be selected is used as a clock signal for the flip-flop 137. The flip-flop 137 then delivers an ancillary pulse signal PSO.

Figure 16:
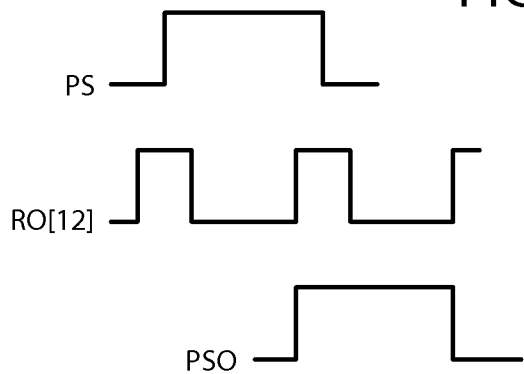
Figure 17:
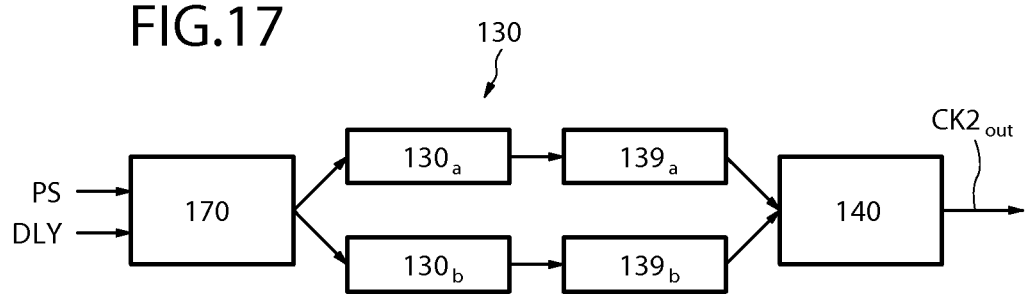

FIG. 16 illustrates schematically an operational timing diagram. It can be seen that the pulse of the secondary pulse signal PS is effectively delayed by the selected phase RO[12] so as to form the pulse of the ancillary signal PSO.

Furthermore, in order to have sufficient time margins to avoid the uncertainties in the start/end of a period, the selection operation is over two cycles. For this purpose, as illustrated schematically in FIG. 17, the operation runs in parallel between two channels each having a pulse rate of one pulse per two cycles.

More precisely, the processing circuit 130 comprises on each channel a processing block 130a (130b) analogous to that illustrated in FIG. 15 followed by a delay element 139a (139b).

The two channels are connected at the input to a state machine 170 receiving the signals PS, DLY identical to the element 132 in FIG. 8. The two channels are connected at the output to an OR logic gate 140 allowing the recombination of the signals and delivering the intermediate pulse signal $CK2_{out}$.

Figure 18:
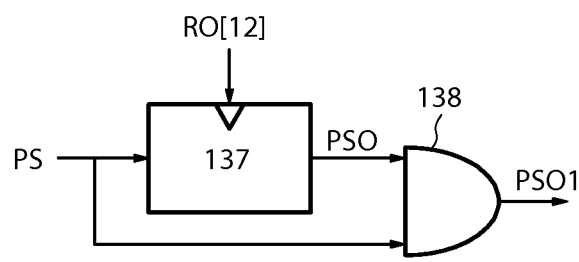

Furthermore, as illustrated schematically in FIG. 18, it is particularly advantageous to provide an AND gate 138 connected to the output of the synchronous flip-flop 137 for receiving the ancillary signal PSO and whose other input receives directly the secondary pulse signal PS. This AND gate 138, which delivers the signal PSO1 to the corresponding delay element (139a or 139b), limits the width of the generated pulse in order to avoid any overlapping during the recombination of the two channels.

In order to guarantee good selection margins, it is preferable for the selection window (signal PS) to be well centered on the pulse that it is desired to select. It is thus preferable to provide for example at least ¼ of a cycle of margin between the edges of a window and the edge i (phase RO[i]) to be selected.

It is also preferable to provide a margin for the establishment of the command of the multiplexer 135.

This may be adjusted by delaying the window with a chosen delay which depends on the selection.

In practice, this can be implemented using a pair of flip-flops of the type of the flip-flop 137 in FIG. 15 connected in series via their data input/output and whose respective clock inputs are intended to receive a phase RO[i] taken from between two different ranges of phase.

Furthermore, another flip-flop has its data input designed to receive the secondary signal PS and its data output connected to the data input of the first flip-flop of the pair. This other flip-flop is designed to delay the window by the chosen delay.

Furthermore, in an analogous manner to what is illustrated in FIG. 18, an AND logic gate at the output of the pair of flip-flops limits the width of the pulse generated to between ¼ and ¾ of a cycle in order to avoid overlapping during the recombination of the two channels by the logic gate 140.

In the variants that have just been described the width of the pulse of the signal $CK2_{out}$ is not adjustable (1 cycle for the variant with delay lines, and between ¼ and ¾ of a cycle for the embodiment with a pair of flip-flops for the selection of the window). This is the reason why a divider is provided at the output in order to normalize the duty cycle and obtain, for the pulse signal $CK_{out}$, a period equal to $T_{in}/N$.

It is possible to adjust this duty cycle to 50% or another desired value and hence obtain, for the pulse signal $CK_{out}$, a period equal to $T_{in}/N$, without using a frequency divider. This allows either the maximum output frequency, at equal power, to be doubled or, at equivalent output frequency, the frequency of the oscillator and of operation of the synchronous block, and hence the dynamic power consumed, to be divided by two.

In practice, this can be obtained for example by duplicating the aforementioned said pair of flip-flops and by supplying on the clock input of each of these two duplicated flip-flops a signal equal to the sum of the auxiliary signal DLY and of an additional signal generated by the first stage 12 and corresponding, in the example described here, to $16T_{out}/(2T_{RO})$. For example, for $T_{out}=1.5$ times $T_{RO}$, the digital word corresponding to this additional signal is equal to 1100 (i.e. 12 in decimal notation). Thus, the output of the two duplicated flip-flops will change twelve $16^{ths}$ of a cycle after that of the pair of flip-flops. The output pulse will have a width of 12/16 for a period of 1.5 (=24/16) in other words a duty cycle of 50%.

The value of this additional signal is here always in the range between 8 and 15 which can be represented with a word of 4 bits.

However, it would also be possible to modify the value of the additional signal in order to obtain a duty cycle different from 50%.

It should be noted that this last variant is preferably used for values of $T_{out}$ in the range between $T_{RO}$ and two times $T_{RO}$.

On the other hand, for values of $T_{out}$ higher than two times $T_{RO}$, the embodiments with frequency division by two will preferably be used.

The invention claimed is:
1. A device for generating a pulse signal, comprising:
an input configured to receive an initial pulse signal having an initial period;
an oscillator configured to generate at least one oscillator signal;
a first stage synchronized with the at least one oscillator signal and configured to deliver:

a secondary pulse signal having a separation between two successive pulses that is representative of an integer part of a division of the initial period by an integer N; and an auxiliary signal representative of a fractional part of the division and containing, for each pulse of the secondary pulse signal, an indication of a delay to be applied to that pulse taking into account the separation between that pulse and a preceding pulse; and a second stage that receives the successive pulses of the secondary pulse signal and corresponding delay indications and is configured to select one from among plurality of nonzero delays to apply to different pulses of the secondary pulse signal as a function of the corresponding delay indications to thereby generate successive corresponding pulses of the pulse signal.

2. The device according to claim 1, wherein the first stage comprises:
a first module that receives the initial pulse signal, synchronized to the at least one oscillator signal, and is configured to deliver successions of:
first digital words representative of the integer part of the division by N of a ratio between the initial period and a period of the at least one oscillator signal; and
second digital words representative of the fractional part of the division by N of the ratio, and
a second module comprising:
a first counting circuit synchronized to the oscillator signal,
a second counting circuit synchronized to the oscillator signal and incremented by a current second digital word, and
a processing circuit configured, when a current value of the first counting circuit is equal to a value of a current first digital word, to reset the first counting circuit, deliver a pulse of the secondary pulse signal and deliver content of the second counting circuit as an indication of delay of the auxiliary signal associated with the pulse of the secondary pulse signal.

3. The device according to claim 2, wherein the first module comprises:
a detection circuit synchronized to the oscillator signal and configured to detect edges of the initial pulse signal and deliver control signals in response to occurrences of the edges,
an initial counting circuit synchronized to the oscillator signal and resettable upon occurrence of each control signal, and
a synchronous flip-flop having a data input connected to an output of the initial counting circuit and controlled by the control signals so as to deliver, upon a current occurrence of a control signal, the current first digital word and a current second digital word.

4. The device according to claim 3, wherein the detection circuit comprises:
an edge-triggered D flip-flop periodically timed by the at least one oscillator signal and coupled to receive the initial pulse signal, and
a logic circuit comprising a logic gate having a first input connected to an output of the edge-triggered D flip-flop, a second input connected to the input of the edge-triggered D flip-flop, and an output configured to deliver successive control signals.

5. The device according to claim 3, wherein the initial counting circuit and the synchronous flip-flop are timed by a timing signal whose period is twice the period of the at least one oscillator signal.

6. The device according to claim 5, wherein the indication of the delay of the auxiliary signal to be applied to the pulse of the secondary pulse signal comprises a digital word of b bits, the oscillator is a multiphase oscillator configured for delivering 2b oscillator elementary signals, one of the oscillator elementary signals forming the at least one oscillator signal, the 2b oscillator elementary signals being delayed by a delay corresponding to the period of the at least one oscillator signal divided by 2b, and the second stage comprises a first input receiving the pulse of the secondary pulse signal, a second input receiving the digital word of b bits, and a third input receiving the 2b oscillator elementary signals, and is configured to select one of the oscillator elementary signals depending on a value of the digital word of b bits and generate the pulse signal starting from the secondary pulse signal and from the selected oscillator elementary signal.

7. The device according to claim 6, wherein the second stage comprises a processing circuit forming:
a first sub-stage comprising the first, second and third inputs and configured to select the one of the oscillator elementary signals depending on a value of the digital word of b bits and to generate, starting from the secondary pulse signal and from the selected oscillator elementary signal, an intermediate pulse signal whose period is equal to Tin/2N, where Tin denotes the initial period, a pulse signal; and
a second sub-stage configured for carrying out a frequency division by two of the intermediate pulse signal so as to deliver the pulse signal having a period equal to Tin/N.

8. The device according to claim 7, wherein the processing circuit comprises a multiplexer whose data inputs form the third input, whose control input forms the second input, and an AND logic gate having one input connected to an output of the multiplexer and another input which forms the first input.

9. The device according to claim 6, wherein the second stage comprises at least one synchronous flip-flop whose data input forms the first input and whose clock input forms the second input.

10. The device according to claim 1, wherein the second stage comprises a plurality of delay lines that are modulatable and configurable by the auxiliary signal to generate the plurality of nonzero delays and which receive the secondary pulse signal at an input.

11. The device according to claim 10, wherein the indication of the delay of the auxiliary signal to be applied to the pulse of the secondary pulse signal comprises a digital word of b bits, wherein at least one of the plurality of delay lines comprises b1 elementary modules, b1 being equal to at least 2b, each elementary module configured to delay a pulse of the secondary pulse signal by a delay corresponding to a period of the at least one oscillator signal divided by 2b, and wherein one or more elementary modules is selected depending on a value of the digital word of b bits.

12. The device according to claim 11, wherein b1 is greater than 2b.

13. The device according to claim 10, wherein the second stage comprises:
a first sub-stage carrying out the combination of the pulses of the secondary pulse signal and the corresponding delay indications so as to deliver an intermediate pulse signal whose period is equal to Tin/2N, where Tin denotes the initial period, and a second sub-stage configured to carry out a frequency division by two of the intermediate pulse signal so as to deliver the pulse signal (CKout) with a period equal to Tin/N.

14. The device according to claim 13, wherein the first sub-stage of the second stage includes the plurality of delay lines connected in parallel between a state machine configured to receive the secondary pulse signal and the auxiliary signal, and an OR logic gate providing the intermediate pulse signal.

15. The device according to claim 14, comprising a first calibration circuit configured to select, for each one of the plurality of delay lines and for each one of the plurality of nonzero delays, a corresponding number of elementary modules with at least b1 possible choices.

16. The device according to claim 15, comprising:
a plurality of structurally identical initial oscillators, and
a second calibration circuit configured to select an oscillator from amongst the plurality of structurally identical initial oscillators.

17. The device according to claim 16, wherein the plurality of structurally identical initial oscillators and the plurality of delay lines are formed using fully-depleted silicon-on-insulator technology and comprise buried electrodes, and wherein the first and second calibration circuits comprise a biasing circuit configured to bias the buried electrodes.

18. The device according to claim 1, implemented as an integrated circuit.

19. A device for generating an output pulse signal, comprising:
an input configured to receive an initial pulse signal having an initial period;
a first stage configured to generate:
a secondary pulse signal having a separation between successive pulses that is representative of an integer part of a division of the initial period by an integer N; and
an auxiliary signal representative of a fractional part of the division and containing an indication of delays to be applied the initial pulse signal; and
a second stage configured to select from among a plurality of nonzero delays to apply to pulses of the secondary pulse signal as a function of corresponding delay indications to thereby generate the output pulse signal.

20. The device according to claim 19, wherein the second stage comprises a plurality of delay lines that are modulatable and configurable by the auxiliary signal to generate the plurality of nonzero delays.

21. The device according to claim 20, wherein the indication of the delay of the auxiliary signal to be applied to the pulses of the secondary pulse signal comprises a digital word of b bits, wherein at least one of the plurality of delay lines comprises b1 elementary modules, b1 being equal to at least 2b, each elementary module configured to delay a pulse of the secondary pulse signal by a given delay, and wherein one or more elementary modules is selected depending on the digital word of b bits.

* * * * *